United States Patent
Kropiewnicki (10) Patent No.: US 12,200,856 B2
(45) Date of Patent: Jan. 14, 2025

(54) INSULATING UNIT FOR CIRCUIT BOARD

(71) Applicant: HARTING Electric Stiftung & Co. KG, Espelkamp (DE)

(72) Inventor: Norbert Kropiewnicki, Bielefeld (DE)

(73) Assignee: HARTING Electric Stiftung &Co. KG, Espelkamp (DE)

( * ) Notice: Subject to any disclaimer, the term of this patent is extended or adjusted under 35 U.S.C. 154(b) by 33 days.

(21) Appl. No.: 17/766,865

(22) PCT Filed: Oct. 19, 2020

(86) PCT No.: PCT/DE2020/100898
§ 371 (c)(1),
(2) Date: Apr. 6, 2022

(87) PCT Pub. No.: WO2021/083454
PCT Pub. Date: May 6, 2021

(65) Prior Publication Data
US 2024/0090124 A1    Mar. 14, 2024

(30) Foreign Application Priority Data

Oct. 30, 2019    (DE) .................... 10 2019 129 375.8

(51) Int. Cl.
*H05K 1/02* (2006.01)
*H05K 1/18* (2006.01)
(Continued)

(52) U.S. Cl.
CPC ........... *H05K 1/0256* (2013.01); *H05K 1/181* (2013.01); *H05K 3/0005* (2013.01);
(Continued)

(58) Field of Classification Search
CPC .... H05K 1/0256; H05K 1/181; H05K 3/0005; H05K 5/0069; H05K 2201/09063; H05K 2201/10015; H05K 2201/10522
(Continued)

(56) References Cited

U.S. PATENT DOCUMENTS 5,500,786 A * 3/1996 Ono ..................... H05K 1/0256
361/752
6,563,056 B1    5/2003 Belwon et al.
(Continued)

FOREIGN PATENT DOCUMENTS

CN    209517624 U    10/2019
DE        3423648 C1    10/1985
(Continued)

OTHER PUBLICATIONS

Mecadtron GmbH: NEXTRA—3D-Kriechstreckenanalyse. 90461 Nürnberg, Nov. 5, 2014.—Company Publication. https://www.flowcad.ch/cms/upload/ds_pcb/NEXTRA_3D-Kriechstreckenanalyse.pdf [retrieved on Aug. 4, 2020].
(Continued)

*Primary Examiner* — Peter G Leigh
(74) *Attorney, Agent, or Firm* — Smartpat PLC (57) ABSTRACT

A circuit board has an upper face and a lower face. The circuit board comprises at least two circuits, with each of the at least two circuits comprising at least one conductor track and at least one current carrying electronic component. The circuit board has at least one through-hole which is provided with at least one insulating unit. The at least one insulating unit is arranged in the at least one through-hole and so is mechanically connected to the circuit board and thus is positioned between a first circuit and at least one second circuit of the circuit board.

12 Claims, 4 Drawing Sheets

(51) Int. Cl.
  *H05K 3/00*   (2006.01)
  *H05K 5/00*   (2006.01)
(52) U.S. Cl.
  CPC . *H05K 5/0069* (2013.01); *H05K 2201/09063* (2013.01); *H05K 2201/10015* (2013.01); *H05K 2201/10522* (2013.01)
(58) Field of Classification Search
  USPC .......................................................... 439/701
  See application file for complete search history.

(56) References Cited

U.S. PATENT DOCUMENTS

| | | | | |
|---|---|---|---|---|
| 8,023,274 | B2* | 9/2011 | Hughes | H05K 1/0256 361/753 |
| 8,587,952 | B1* | 11/2013 | Hughes | H05K 1/0256 361/753 |
| 2008/0009145 | A1 | 1/2008 | Zhou | |
| 2008/0198563 | A1* | 8/2008 | Hughes | H05K 1/0256 361/758 |
| 2014/0048322 | A1 | 2/2014 | Chen et al. | |
| 2015/0070854 | A1 | 3/2015 | Best et al. | |

FOREIGN PATENT DOCUMENTS

| | | | |
|---|---|---|---|
| DE | 4425325 A1 * | 4/1995 | ........... H05K 1/0256 |
| DE | 102004041207 A1 | 3/2006 | |
| DE | 102012102567 A1 | 9/2013 | |
| DE | 102012018751 A1 | 2/2014 | |
| JP | WO 2018151134 A1 * | 8/2018 | ........... H05K 1/0243 |
| KR | 20150114372 A | 10/2015 | |
| WO | 0072647 A1 | 11/2000 | |

OTHER PUBLICATIONS

Mecadtron GmbH: NEXTRA—Kriechstreckenanalyse. 90461 Nurnberg, Feb. 16, 2012.—Company publication. https://www.flowcad.ch/cms/upload/ds_pcb/NEXTRA_Kriechstreckenanalyse_ch.pdf [retrieved on Aug. 4, 2020].

Mecadtron GmbH: NEXTRA Luftstreckenanalyse. 90461 Numberg, Feb. 16, 2012.—Company publication. https://www.flowcad.ch/cms/upload/ds_pcb/NEXTRA_Luftstreckenanalyse_ch.pdf [retrieved on Aug. 4, 2020].

* cited by examiner

Fig. 4

INSULATING UNIT FOR CIRCUIT BOARD

TECHNICAL FIELD

The disclosure relates to a circuit board. The circuit board is equipped with an insulating unit in order to maintain standardized clearances and creepage distances in the case of a compact assembly.

Furthermore, the disclosure relates to a plug connector with a circuit board.

In addition, the disclosure relates to a method for producing a circuit board.

Circuit boards of this type are required in order to realize electrical circuits with electronic components in a space-saving manner, for example. Circuit boards are also known as a printed circuit board (PCB).

BACKGROUND

In order to be able to achieve desired, ever smaller designs, insulation-specific principles must be observed in order to avoid defects and/or malfunctions. In this case, so called clearances and creepage distances must in particular be maintained. Particularly compact designs for circuit boards, for example for using in electrical plug connectors, can barely achieve the required clearances and creepage distances solely by spacing two circuits on the circuit board. Corresponding components, circuits, or entire circuit boards are usually sealed with insulating plastics materials, lacquers and/or resins in order to maintain clearances and creepage distances.

However, removing and/or exchanging the electrical or electronic components in a non-destructive manner in the case of a defect is barely possible through this procedure.

DE 34 32 648 A1 at the time recognized the problem of small clearances and creepage distances in the case of perforated grid plates, which are used less commonly nowadays. Consequently, improving a printed board arrangement, in particular for electrical connection strips, consisting of a printed board with a predetermined grid of connection holes and made of electrical components, which are to be arranged thereon and are provided with insulating material housings, with soldered connections which are plugged into the connection holes is proposed by providing recesses with partition wall pieces that can be inserted through them and are made of insulating material in the printed board in the direction of the row of the soldered connections in each case between the connection holes or between predetermined groups of connection holes, which recesses are connected to the insulating material housings of the components.

The disadvantage of this design is in particular the limitation to gridded printed boards, referred to as circuit boards hereinafter, as well as the restriction of the use of partition wall pieces made of insulating material to the insulating material housing of the electrical components being used.

SUMMARY

An object of the disclosure involves making a circuit board as compact as possible while maintaining the necessary clearances and creepage distances. Furthermore, possible application of a circuit board of this type is to be expanded. Moreover, the production of the printed board is to be simplified.

The object is achieved by the subject matter of the independent claims.

Advantageous configurations of the invention are specified in the subclaims and in the following description.

The disclosure is based on a circuit board with an upper side and a lower side, wherein the circuit board has at least two circuits. In this case, each of the at least two circuits has at least one conductor track and at least one current-carrying electronic element. Furthermore, the circuit board has at least one through opening which is provided with at least one insulating unit. The at least one insulating unit is arranged in the at least one through opening and is thus mechanically connected to the circuit board and in this case is positioned between a first circuit and at least one second circuit of the circuit board. The positioning of the insulating unit in a region between the at least two circuits establishes a simple possibility for maintaining required insulation distances. These insulation distances predominantly relate to the so called clearances and creepage distances. Alternative insulation processes may ideally be dispensed with by using the insulating unit. Alternative insulation processes, such as casting electronic components with a plastics material, for example, usually have the consequence that it is not possible to exchange the cast-in components or only in a restricted manner. In particular, repair operations are therefore simplified. Furthermore, the production process of a circuit board is improved. This is due to the fact that the assembly process of the circuit board can be completed by assembling the circuit board with an insulating unit according to the invention. A lacquer finish or casting with plastics materials may ideally be dispensed with.

One particular advantage involves adapting the design and positioning of the insulating unit to the requirements of a circuit design of the circuit board in a very flexible manner. This advantage entails the further advantage that a circuit design can be transferred to a circuit board in a particularly space-saving manner.

One further embodiment establishes a circuit board with an insulating unit mentioned previously, wherein the insulating unit at least in principle reaches the height of a highest electronic element of the first circuit or the second circuit. This configuration takes into account electronic elements which are installed particularly horizontally. A cylindrical capacitor is therefore usually provided with conductors for connecting to a circuit board, which project out of an end face of the cylindrical body. If a cylindrical capacitor of this type is placed with its circumferential side onto the circuit board, for example in order to reduce the overall height of the circuit board. Even in the best case, the current-carrying conductors of the capacitor project at least beyond a height out of the circuit board which at least in principle is equal to the radius of the capacitor. The design of an insulating unit with the height which is equal to the diameter of the cylindrical capacitor significantly increases the clearance to an adjacent circuit. Likewise, the creepage distance is further increased relative to an adjacent circuit.

In one further embodiment, a circuit board is fitted with an insulating unit, wherein the insulating unit completely delimits a boundary region between the first circuit and at least the second circuit. This means that, along a region in which a circuit approaches another circuit, a through opening is located which is pierced by an insulating unit at least in the boundary region, such that the insulating unit spatially separates the circuits from one another. This embodiment makes it possible to increase the length of the clearance and the creepage distance between the relevant circuits in a simple manner.

In one useful embodiment, a circuit board is provided with an insulating unit, wherein the insulating unit at least partially fills the through opening of the circuit board. This means that the insulating unit does in fact project through the through opening between the at least two circuits but the through opening can be designed to be larger, for example for attaching other components, than is necessary for the insulation between a first circuit and a second circuit through the insulating unit. It is therefore possible to firstly achieve the necessary clearance and creepage distance through the insulating unit and at the same time fix the circuit board in a housing or on a superordinate component. Moreover, this embodiment makes it possible for a through opening to be designed to receive more than one insulating unit at the same time. A first insulating unit in a through opening can therefore spatially separate a first circuit from a second circuit. A second insulating unit can now be molded through the same through opening in such a way that a first circuit is separated from a third circuit. Likewise, a second insulating unit can of course also separate a third circuit from a fourth circuit. Moreover, this can enable a simple and further improved enlargement of the known insulating sections, i.e. the clearances and the creepage distances. If a first insulating unit according to the invention and a second insulating unit according to the invention are fed through the through opening from opposite sides of the circuit board, for example, further mold elements molded on the insulating units can be brought into engagement with one another. A combing is therefore achieved which advantageously uses an effect comparable to a labyrinth seal in order to further increase the clearances and the creepage distances. Instead of a second insulating unit, a surrounding device housing can also have moldings and/or elements which can be brought into engagement with the insulating unit in a combing manner.

In one advantageous embodiment, the circuit board possesses an insulating unit, wherein a latching element is arranged on the insulating unit by means of which a positive connection to the printed board is produced. A latching hook can be molded on the insulating unit in a simple manner. After inserting the insulating unit through the through opening, this would attach to an edge formed by the through opening on the circuit board and would prevent undesired releasing of the insulating unit from the circuit board. A ridge on the insulating unit can also be sufficient in order to fix the insulating unit to the circuit board after feeding the section provided for this purpose of the insulating unit through the through opening. Moreover, a further latching element can be provided on the insulating unit, in order to connect the circuit board to a surrounding component.

In one embodiment, the circuit board is provided with an insulating unit, wherein the insulating unit is molded in such a way that the insulating unit forms at least one connection between the through opening and at least one edge of the circuit board. In other words, an insulating unit is molded as a half shell, for example. In this case, at least one protrusion projects beyond at least two edges of the circuit board respectively. An insulating unit therefore has a protrusion which is fed through a through opening in the circuit board and at least partially spatially separates at least one first circuit from a second circuit. A second protrusion projects beyond one side of the circuit board, for example. The first protrusion and the second protrusion are connected to at least one plate. This embodiment is advantageously molded in one piece. According to one further embodiment, a circuit board is provided with an insulating unit, wherein the insulating unit at least partially encloses the upper side or at least partially encloses the lower side of the circuit board. The plate of the developed insulating unit is ideally configured in such a way that at least one first circuit is in principle covered on at least the upper side of the circuit board or at least on the lower side of the circuit board. The plate of the insulating unit is held on the circuit board by the protrusions mentioned previously.

One embodiment of the circuit board advantageously makes provision for the insulating unit to be produced from a synthetic, non-conductive material. Further safety conditions can be met by using a particularly puncture-proof plastics material. Moreover, a one-piece embodiment is cost effective and comparatively easy to achieve as a result of being produced from a plastics material.

Moreover, the invention establishes a plug connector with a circuit board, wherein the circuit board is arranged inside a housing of the plug connector and is engaged with an inside wall of the housing. A molding on the inside wall interacts with the insulating unit, in order to additionally increase the clearances and creepage distances between at least the two circuits. A plug connector of this type can receive sensor technology, for example, in order to directly process and/or transfer information with respect to the plug connection or similar physical conditions. A circuit board can assume compact dimensions by way of an insulating unit according to the invention. A circuit board reduced in size with the insulating unit according to the invention can therefore be accommodated between the inside wall of the housing and a contact carrier, for example. By way of an aforementioned combing of a molding on the inside wall of the plug connector and the insulating unit of the circuit board, the circuit board, even during production, may initially be configured in such a way that the clearances and creepage distances are not maintained. The combing between the housing inside wall and the insulting unit can maintain the required clearances and creepage distances through application in the plug connector housing according to the invention. This embodiment results in further possibilities with respect to a desirable minimization of circuit boards, also in applications other than plug connectors. A sensor with a molding on the inside wall of the housing can therefore also be used, for example, in order to be brought into engagement with an insulating unit in a combed manner.

Furthermore, the disclosure establishes a method for producing a circuit board, comprising at least the following steps:
  a. creating a circuit diagram with the at least two circuits;
  b. planning the positioning of electronic elements based on the circuit diagram while simultaneously configuring and positioning the at least one insulating unit;
  c. determining a suitable configuration of the circuit board;
  d. creating an unassembled circuit board according to the preceding method steps;
  e. assembling the unassembled circuit board with electronic elements according to the circuit diagram;
  f. assembling the circuit board with the at least one insulating unit.

In principle, it is clear to the person skilled in the art than in particular steps a. to c. are combinable or interchangeable with one another. In particular, production methods in which casting the components with a plastics material or lacquering the circuit board is necessary in order to maintain the clearances and creepage distances cost time. The application of an insulating unit according to the invention can save time, since the insulating unit according to the invention is subsequently connected to the circuit board in a simple manner after the actual assembly process. An insulating unit which is provided with latching means is ideally used for particularly fast production. This makes it possible to finish production of the circuit board by means of simple latching of the insulating unit to the circuit board after assembly with electronic components. Of course, soldering the electronic components in this case is assumed to be a step in the assembly in order to produce the functionality of the circuit board. Production of the circuit board therefore takes place using the steps which are known in principle. The circuit board itself is firstly produced. The circuit board is optionally already provided at least in places with an insulating lacquer layer at this point. The selected electronic components are inserted into their intended slots. The electronic components are soldered to the circuit board at the soldering surfaces provided. Finally, at least one insulating unit according to the invention is fed through at least one through opening provided and is connected to the circuit board. A positive connection is ideally made between the circuit board and the at least one insulating unit. Of course, alternatives are known to the person skilled in the art. In particular, a cohesive connection, for example by means of an adhesive, a lacquer or a plastics material are simple but certainly viable alternatives.

One further advantageous method makes provision for assigning at least the following sub-steps to step b. of the preceding design:

b.1 determining a dimensioning of the circuit board;

b.2 calculating the shape of the at least one insulating unit;

b.3 calculating the at least one through opening;

b.4 checking the dimensioning of the circuit board taking into account the necessary clearances and creepage distances when using the insulating unit.

The person skilled in the art also recognizes here that individual sub-steps can be combined or mutually exchanged. The sub-steps specifically relate to the step of configuring and planning the circuit board according to the invention and the associated insulating unit. It is useful to firstly consider to which area of application the circuit board is preferably allocated. The spatial dimensions which the circuit board ideally occupies are often derived from this in advance. Owing to the thus known factors of the size of the circuit board and the circuits which are to be applied to the circuit board, the dimensions of the insulating unit can thus be calculated. The dimensions of the insulating unit are now derived from the necessary insulation factors, i.e. the clearances and creepage distances. As soon as the dimensions of the insulating unit are calculated, the through opening required for the insulating unit can be determined. A final test secures the configured embodiment. A computer simulation can also be particularly useful instead of a real test, in particular for reasons related to cost.

In one preferred method, at least one step of the methods mentioned previously is at least supported by at least one computer program. In this case, method step b. as well as its sub-steps b.1 to b.4 appear to be particularly suitable for support from a computer program. It is also conceivable to use two synchronized computer programs, wherein a first computer program performs a first method step and a second computer program performs a second method step. In this case, the at least one computer program calculates the corresponding data in such a way that method steps a. and b. or sub-steps b.1 and b.2, for example, are processed at least approximately simultaneously.

BRIEF DESCRIPTION OF THE DRAWINGS

An exemplary embodiment of the invention is represented in the drawings and is explained in greater detail hereinafter. In the drawings.

DETAILED DESCRIPTION

The figures contain partially simplified, schematic representations. Identical reference numbers are, in part, used for the same but possibly not identical elements. Different views of the same elements could be scaled differently. Directional information such as "left", "right", "above" and "below", for example, are intended to be understood with reference to the respective figure and may vary in the individual representations compared to the object represented.

Figure 1:
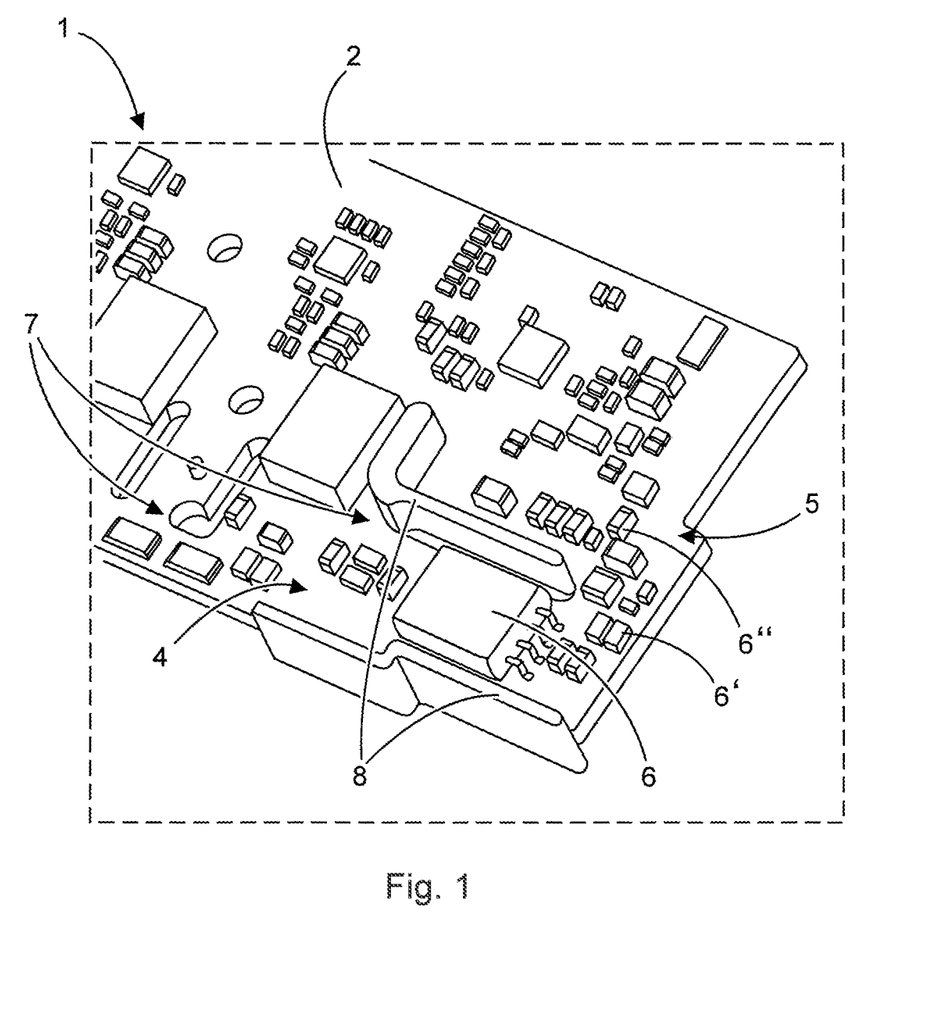
FIG. 1 shows a perspective representation of the upper side of a circuit board with an insulating unit.

FIG. 1 shows the upper side 2 of a circuit board 1 with a particularly space-saving arrangement of the electronic elements 6, 6', 6". The insulating unit 8 is used according to the invention in order to enable such a compact arrangement on the printed board 1. The insulating unit 8 separates the first circuit 4 at least for the most part from the second circuit 5. In this case, it becomes clear that the insulating unit 8 projects through a through opening 7 in the circuit board 1. The electronic elements 6, 6' and 6" are represented and numbered on the circuit board 1 by way of example. The electronic element 6 shown is an integrated circuit module (IC module). The electronic elements 6' and 6" can be different surface mount components, also referred to as SMD (surface-mounted device/s). Electronic elements such as 6' are usually SMD resistors. The electronic element 6" is an SMD capacitor. Further electronic elements can be designed in an optically similar manner and can be used instead of the designated electronic elements. In this case, it should be recognized that the insulating unit 8 reaches or projects beyond the height of the electronic elements 6, 6' and 6" used. In the case represented, the first circuit 4 is part of a switching circuit which is spatially interrupted by the electronic element 6 and is continued at the electronic element 6 opposite the circuit 4 as a second circuit 5.

Figure 2:
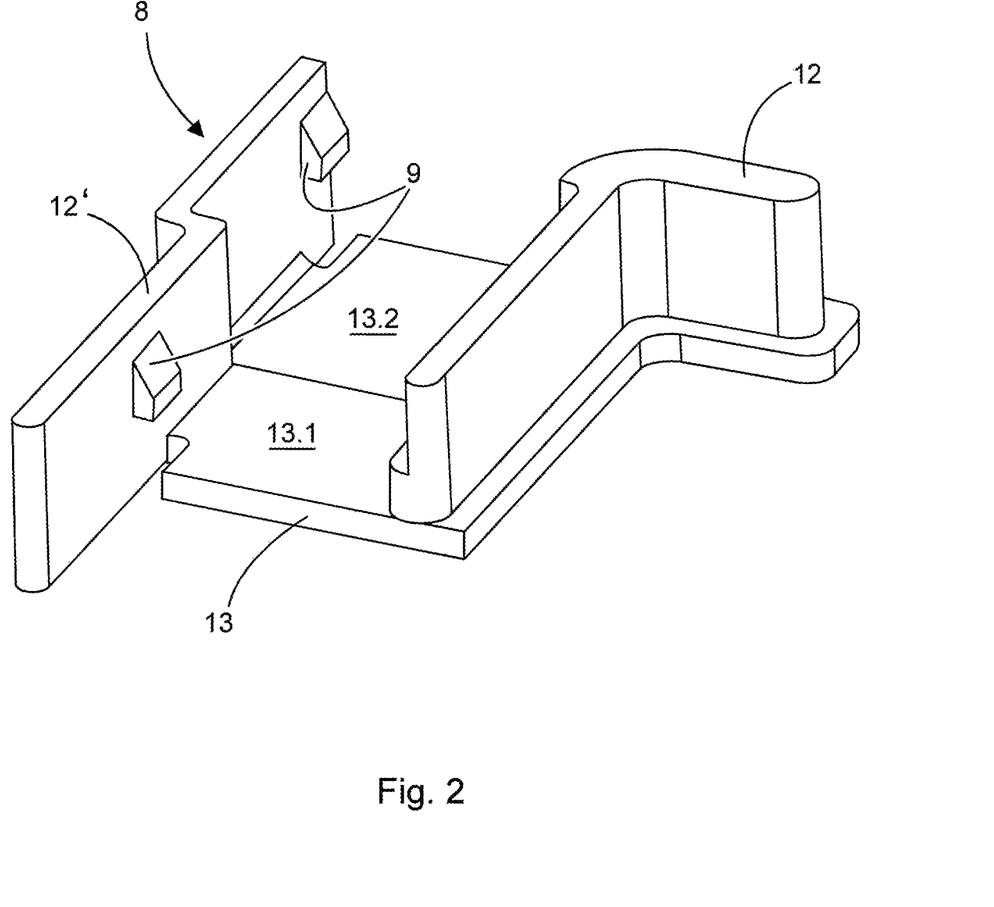
FIG. 2 shows a perspective representation of an insulating unit.

In FIG. 2, the insulating unit 8 according to the invention used in FIG. 1 is represented in a perspective manner. In this case, a possible molding of an insulating unit 8 according to the invention is shown. The embodiment represented is composed of an insulating plate 13 and insulating elements 12 and 12' which project out of the insulating plate 13. In principle, a design consisting of merely one of the insulating elements 12 or 12' is conceivable. However, in the case of the represented embodiment of the insulating unit 8, a comprehensive insulation of the circuits to be shielded can be achieved. For this purpose, the insulating unit 8 with the insulating element 12 is fed through a through opening 7 in the circuit board 1. At the same time, the insulating element 12' is fed along an edge at a peripheral region of the circuit board. In this case, the insulating unit 8 is provided with latching elements 9. The latching elements 9 latch on an edge of the peripheral region of the circuit board 1. The insulating unit 8 is thus connected to the circuit board 1 in a secure but releasable manner. Moreover, it is also conceivable to provide the insulating element 12 with at least one latching element 9. Depending on the design of the circuit board 1 and the insulating unit 8, thought can be given to the arrangement and dimensioning, and/or to the use of latching elements similar to the latching elements 9. It may be useful to possibly use alternatives, for example a ridge on the insulating elements 12 and/or 12'. Moreover, further latching elements which have an opposite orientation to the latching elements 9 can be used along an at least in principle parallel plane to the insulating plate 13. This makes it possible to create stops in a simple manner and without any particular effort for attaching an insulating unit 8 to the circuit board 1. Furthermore, FIG. 2 indicates that the insulating plate 13 can in principle also be molded from plate sections 13.1 and 13.2 located on two or more planes. Electronic elements, such as the elements 6, 6' and 6" shown previously or equivalent electronic elements, can therefore be bordered and/or enclosed in a precise manner.

Figure 3:
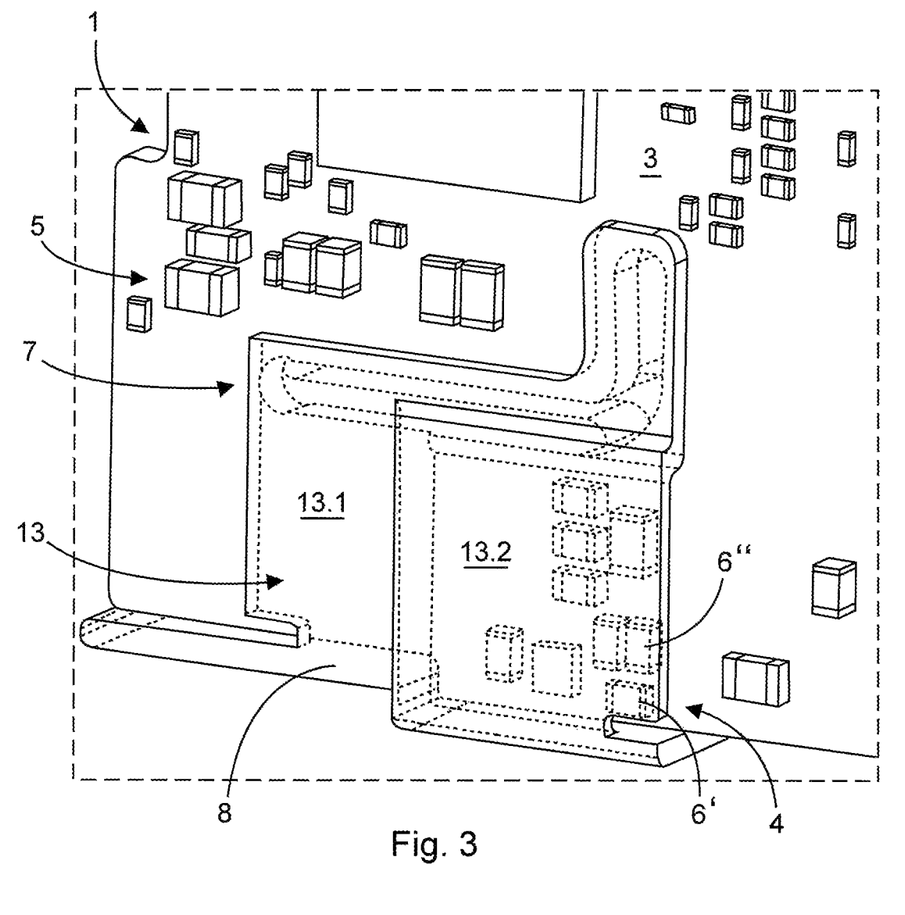
FIG. 3 shows a perspective representation of the lower side of a circuit board with an insulating unit.

FIG. 3 shows by way of example how an embodiment of this type of an insulating unit 8 can be used. In this case, a plate section 13.1 of the insulating plate 13 nestles against the lower side 3 of the circuit board 1. A further plate section 13.2 runs basically parallel to the plate section 13.1 and to the lower side 3 of the circuit board 1. However, electronic components 6' and 6" are arranged under the plate section 13.2. The plate section 13.2 is therefore designed to be further spaced apart from the lower side 3 of the circuit board 1. Furthermore, it becomes clear that the insulating unit 8 can in principle be connected to the circuit board 1 directly during an assembly process of a circuit board 1, after assembly of the circuit board 1 with electronic elements. Sealing the circuit board 1 with insulating lacquers and/or plastics materials can therefore initially be dispensed with. The production process can thus be temporally optimized. However, insulating the circuit board 1 with insulating lacquers and/or plastics materials is not prevented by the insulating unit.

Figure 4:
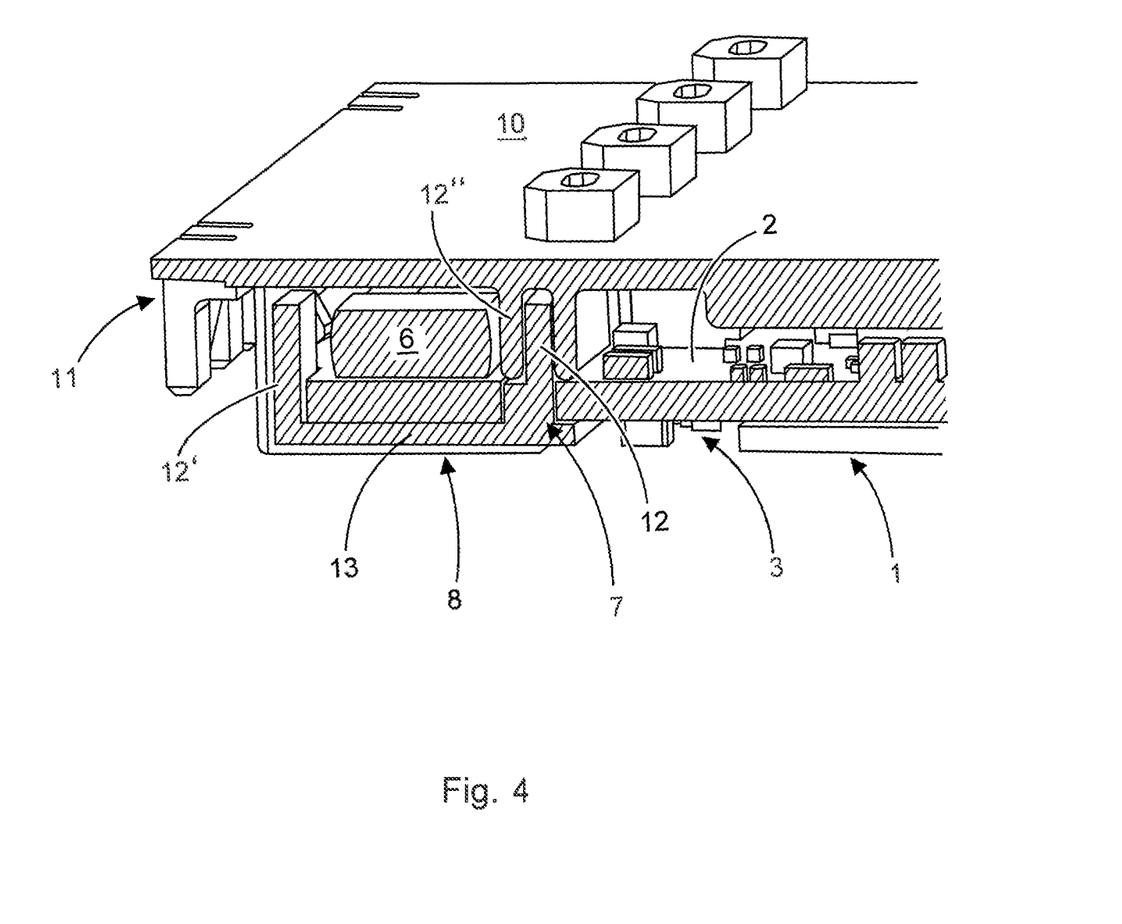
FIG. 4 shows a perspective sectional representation of a circuit board with a housing which interacts with the insulating unit.

One possibility for further increasing the clearances and creepage distances is illustrated in FIG. 4. In this case, a circuit board 1 is assembled with an insulating unit 8 and inserted into a housing 10 which has insulating elements 12" on the inside wall 11. This insulating element 12" can be brought into engagement with the insulating elements 12 and/or 12' of the insulating unit 8. For this purpose, it is useful for the housing 10 to be made of a plastics material. Alternatively, the housing 10, or rather at least the inside wall 11 of the housing 10, can be covered with insulating materials, for example a plastics material on its inside wall 11, in order to achieve an insulating effect. This procedure can be useful in particular in the case of housings which in principle have electrically conductive properties. The represented combing of the insulating elements 12 and 12", which resembles a labyrinth seal, enables further enlargement of the clearances and creepage distances. Moreover, the combing enables secured positioning of the circuit board 1 in a housing 10. FIG. 4 further indicates that the region of the insulating element 12 which projects through the through opening 7 beyond the upper side 2 of the circuit board 1 at least in principle reaches the height of the electronic element 6. In this case, the insulating unit 8 encloses a partial region of the lower side 3 of the circuit board 1. Moreover, the combing of the insulating unit 8 and the inside wall 11 of the housing 10 virtually form a partial housing which in principle surrounds at least one partial region of the circuit board 1.

It is clear to the person skilled in the art—unless otherwise specified—that the combinations represented and discussed are not the only possible combinations, even if different aspects or features of the invention are in each case shown in combination in the figures. In particular, mutually corresponding units or feature complexes from different exemplary embodiments can be exchanged with one another.

LIST OF REFERENCE NUMBERS

1 circuit board
2 upper side
3 lower side
4 first circuit
5 second circuit
6, 6', 6" electronic element
7 through opening
8 insulating unit
9 latching element
10 housing
11 inside wall
12, 12', 12" insulating element
13 insulating plate
13.1, 13.2 plate section

The invention claimed is:
1. A circuit board (1) with an upper side (2) and a lower side (3),
   wherein the circuit board (1) has at least two circuits,
   wherein each of the at least two circuits has at least one conductor track and at least one current-carrying electronic element (6, 6', 6"),
   wherein the circuit board (1) has a through opening (7) which is provided with an insulating unit (8),
   wherein the insulating unit (8) is arranged in the through opening (7) and is mechanically connected to the circuit board (1) and is positioned between a first circuit (4) and a second circuit (5) of the circuit board (1), and
   wherein the insulating unit (8) comprises
      an insulating plate (13) that extends above the at least one current-carrying electronic element (6, 6', 6"),
      a first insulating element (12) that projects from the insulating plate (13) and extends through the through opening (7),
      a second insulating element (12') that projects from the insulating plate (13), and
      a latching element (9) arranged on the second insulating element (12'),
   wherein the second insulating element (12') is latched to a peripheral edge of the circuit board (1) by the latching element (9).
2. The circuit board (1) as claimed in claim 1,
   wherein the insulating unit (8) reaches a height of a highest electronic element (6) of the first circuit (4) or the second circuit (5).
3. The circuit board (1) as claimed in claim 1,
   wherein the insulating unit (8) at least partially delimits a region of the first circuit (4) and the second circuit (5).
4. The circuit board (1) as claimed in claim 1,
   wherein the insulating unit (8) is molded in such a way that the insulating unit (8) forms a connection between the through opening (7) and an edge of the circuit board (1).
5. The circuit board (1) as claimed in claim 1,
   wherein the insulating unit (8) encloses at least parts of the upper side (2) or the lower side (3) of the circuit board (1).

6. The circuit board (1) as claimed in claim 1,
wherein the insulating unit (8) is produced from a synthetic, non-conductive material.

7. A plug connector with a circuit board (1) as claimed in claim 1,
wherein the circuit board (1) is arranged inside a housing (10) of the plug connector and is engaged with an inside wall (11) of the housing (10),
wherein a molding on the inside wall (11) interacts with the insulating unit (8), in order to additionally increase clearances and creepage distances between at least the two circuits (4, 5).

8. The plug connector as claimed in claim 7,
wherein the molding includes a groove into which a portion of the first insulating element (12) engages.

9. The circuit board (1) as claimed in claim 1,
wherein the insulating plate (13) includes
a first plate section (13.1) that nestles against the lower side (3) of the circuit board and
a second plate section (13.1) that extends above the at least one current-carrying electronic element (6, 6', 6").

10. The circuit board (1) as claimed in claim 9,
wherein the first plate section (13.1) extends from the first insulating element (12) to the second insulating element (12').

11. The circuit board (1) as claimed in claim 1,
wherein the through opening (7) and the first insulating element (12) are L-shaped.

12. The circuit board (1) as claimed in claim 1,
wherein the least one current-carrying electronic element (6, 6', 6") includes
a plurality of surface-mounted devices (SMD) on the upper side (2) and
a further plurality of surface-mounted devices (SMD) on the lower side (3).

\* \* \* \* \*